(12) United States Patent
Huang et al.

(10) Patent No.: US 11,670,581 B2
(45) Date of Patent: Jun. 6, 2023

(54) INTERCONNECT STRUCTURE

(71) Applicant: Taiwan Semiconductor Manufacturing Co., Ltd., Hsinchu (TW)

(72) Inventors: Lin-Yu Huang, Hsinchu (TW); Li-Zhen Yu, New Taipei (TW); Chia-Hao Chang, Hsinchu (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 87 days.

(21) Appl. No.: 17/104,760

(22) Filed: Nov. 25, 2020

(65) Prior Publication Data

US 2022/0165659 A1    May 26, 2022

(51) Int. Cl.
| | |
|---|---|
| *H01L 23/522* | (2006.01) |
| *H01L 29/417* | (2006.01) |
| *H01L 21/768* | (2006.01) |
| *H01L 23/532* | (2006.01) |
| *H01L 29/40* | (2006.01) |
| *H01L 23/528* | (2006.01) |

(52) U.S. Cl.
CPC .... *H01L 23/5226* (2013.01); *H01L 21/76816* (2013.01); *H01L 21/76843* (2013.01); *H01L 21/76897* (2013.01); *H01L 23/5283* (2013.01); *H01L 23/5286* (2013.01); *H01L 23/53204* (2013.01); *H01L 23/53209* (2013.01); *H01L 29/401* (2013.01); *H01L 29/41775* (2013.01); *H01L 29/41791* (2013.01)

(58) Field of Classification Search
CPC ..................... H01L 23/5283; H01L 23/53204
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |

(Continued)

*Primary Examiner* — Farun Lu
(74) *Attorney, Agent, or Firm* — Haynes and Boone, LLP

(57) ABSTRACT

A semiconductor structure and the manufacturing method thereof are disclosed. An exemplary semiconductor structure includes a source/drain (S/D) feature formed in an interlayer dielectric layer (ILD), a S/D contact via electrically connected to the S/D feature, a metal feature formed over the S/D contact via, and a metal line formed over the metal feature and electrically connected to the S/D contact via. The metal line is formed of a material different from that of the S/D contact via, and the S/D contact via is spaced apart from the metal line. By providing the metal feature, electromigration between the metal line and the contact via may be advantageously reduced or substantially eliminated.

20 Claims, 14 Drawing Sheets

(56) References Cited

U.S. PATENT DOCUMENTS

| | | | |
|---|---|---|---|
| 9,496,189 B2 | 11/2016 | Yu et al. | |
| 2020/0161439 A1 | 5/2020 | You et al. | |
| 2021/0020628 A1* | 1/2021 | Oh | H01L 27/11529 |
| 2021/0167004 A1* | 6/2021 | Seo | H01L 23/53257 |

* cited by examiner

INTERCONNECT STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, to prevent deterioration of vias or metal lines due to contact with adjacent dielectric layer, the vias or metal lines may be lined with a barrier layer. While existing interconnect structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
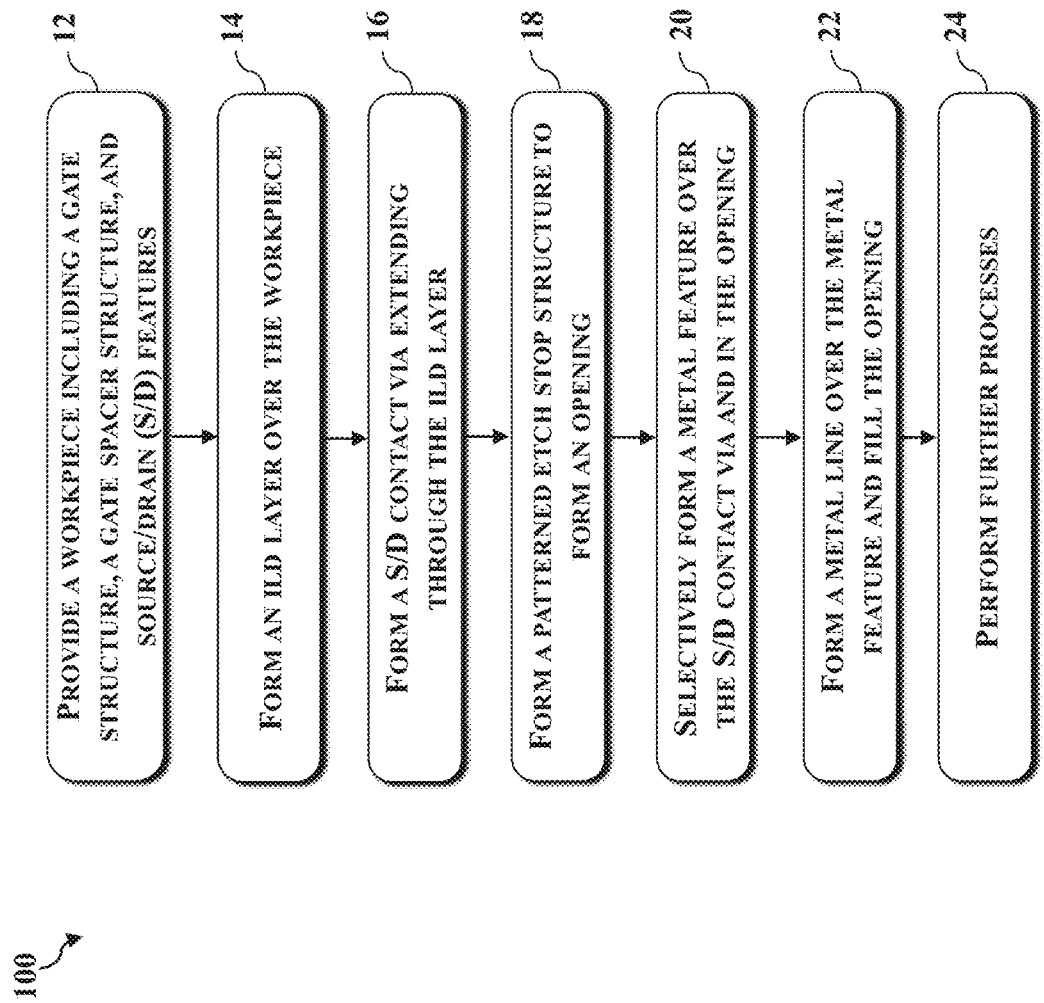
FIG. 1 illustrates a flowchart of a method of forming an exemplary interconnect structure or a portion thereof, in accordance with one or more aspects of the disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming active regions (such as fins), gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

The present disclosure generally relates to reducing or substantially eliminating electromigration and, more particularly, to selective deposition of a metal cap layer above a contact via to mitigate metal migration and reduce contact resistance.

The IC fabrication industry has gone over different conductive materials to improve performance of interconnect structures. For example, aluminum was once a popular conductive material for construction of interconnect structure because of its ready integration with IC fabrication processes and its improved conductivity as compared to doped polysilicon. Due to its susceptibility to electromigration and inferior conductivity compared to copper, aluminum fell out of favor and was gradually replaced by copper, despite the various difficulties in integrating copper into IC fabrication processes. However, while copper is less susceptible to electromigration, it is not immune to it. Electromigration refers to material migration due to presence of current flows. The moving electrons in the current flow are scattered by metal ions in the crystal lattice and their momentum may be transferred to the metal ions. This momentum transfer from the electrons to the metal ions creates a momentum transfer force. When this momentum transfer force is greater than an activation energy of the conductor, a diffusion process of the metal ions along the direction of the moving electrons may be resulted, hence electromigration. Migration of metal atoms along different diffusion paths may result in depletion or accumulation of metal. Depletion is manifested as voids or vacancies and accumulation is manifested as whiskers or hillocks. The growth of voids may cause an onset of a positive feedback loop that accelerates formation of defects. In the positive feedback loop, voids may cause current crowding and increase local current density near the voids, the local current density increase may lead to Joule heating which may cause lowering of activation energies, and the lowered activation energies in turn speed up the material diffusion.

Conductive features (e.g., contact vias and/or metal lines) may be fabricated using, for example, Damascene processes or Dual-Damascene processes. In an exemplary Damascene process, an opening (a via opening or a trench) is formed in a dielectric layer using lithography and etching processes. Copper is then deposited in the opening and a planarization process is performed to remove excess copper, leaving a copper conductive feature in the opening. Allowing copper to come in contact with silicon or silicon oxide has negative implications. For example, copper may diffuse into silicon to degrade the semiconductor properties of silicon and lead to formation of less conductive copper silicide. Oxygen in silicon oxide and copper in the copper conductive layer may inter-diffuse and degrade the conductivity of the copper conductive layer. To prevent copper's contact with silicon and silicon oxide, barrier layers or liners may be implemented to encapsulate the copper conductive feature. As described above, as the geometry size and thus the interconnect structures are getting smaller, the barrier layer is getting thinner. However, the thinned barrier layer would result in metal migration between the metal line and the contact via, for example, thereby impacting device performance and lifetime. In the positive feedback loop, voids and hillocks may grow faster, and the positive feedback loop will accelerate the formation of voids and hillocks, resulting in via bond defects (VBDs), time-dependent dielectric breakdown (TDDB) and resistive-conductive (RC) delay. Here, VBDs refer to defects at the interface between a contact via and a metal line. TDDB refers to degradation of dielectrics due to copper diffusion. RC delay refers to be increase of resistance and/or conductance due to formation of voids or hillocks.

As integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nano sheet transistor. The introduction of multi-gate devices further increases packing densities of source/drain contacts, gate contacts, and interconnect features connecting thereto. Such increased packing densities call for smaller interconnect features and smaller interconnect features lead to increased current density. Because increased current density increases the rate of electromigration, it becomes ever more important to implement processes and device structures to prevent electromigration.

The present disclosure provides interconnect structures and methods to reduce or substantially eliminate electromigration between metal lines and contact vias. Processes according to the present disclosure selectively deposits a metal feature on the contact via such that the contact via is spaced apart from the metal line. Due to the formation of the metal feature, metal migration between the metal line and contact via may be advantageously reduced, and VBDs, TDDB and RC delay due to electromigration may also be reduced. In addition, the contact resistance of the interconnect structure may also be reduced due to the formation of the metal feature.

The various aspects of the present disclosure will now be described in more detail with reference to the figures. FIG. 1 illustrates a flowchart illustrating a method 100 for forming a semiconductor structure or a portion thereof from a workpiece, according to one or more aspects of the present disclosure. Method 100 is described below in conjunction with FIG. 2, which illustrates a three-dimensional (3D) perspective view of a workpiece 200 undergoing various stages of operations in the method of FIG. 1, and FIGS. 3-14, which are diagrammatic fragmentary cross-sectional views of the workpiece 200 taken along line A-A' at different stages of fabrication according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Besides what are explicitly shown in figures of the present disclosure, the semiconductor device 200 may include additional transistors, bipolar junction transistors, resistors, capacitors, diodes, fuses, etc. Throughout the present disclosure, like reference numerals denote like features unless otherwise excepted or described. For avoidance of doubts, throughout the figures, the X direction is perpendicular to the Y direction and the Z direction is perpendicular to both the X direction and the Y direction.

Figure 2:
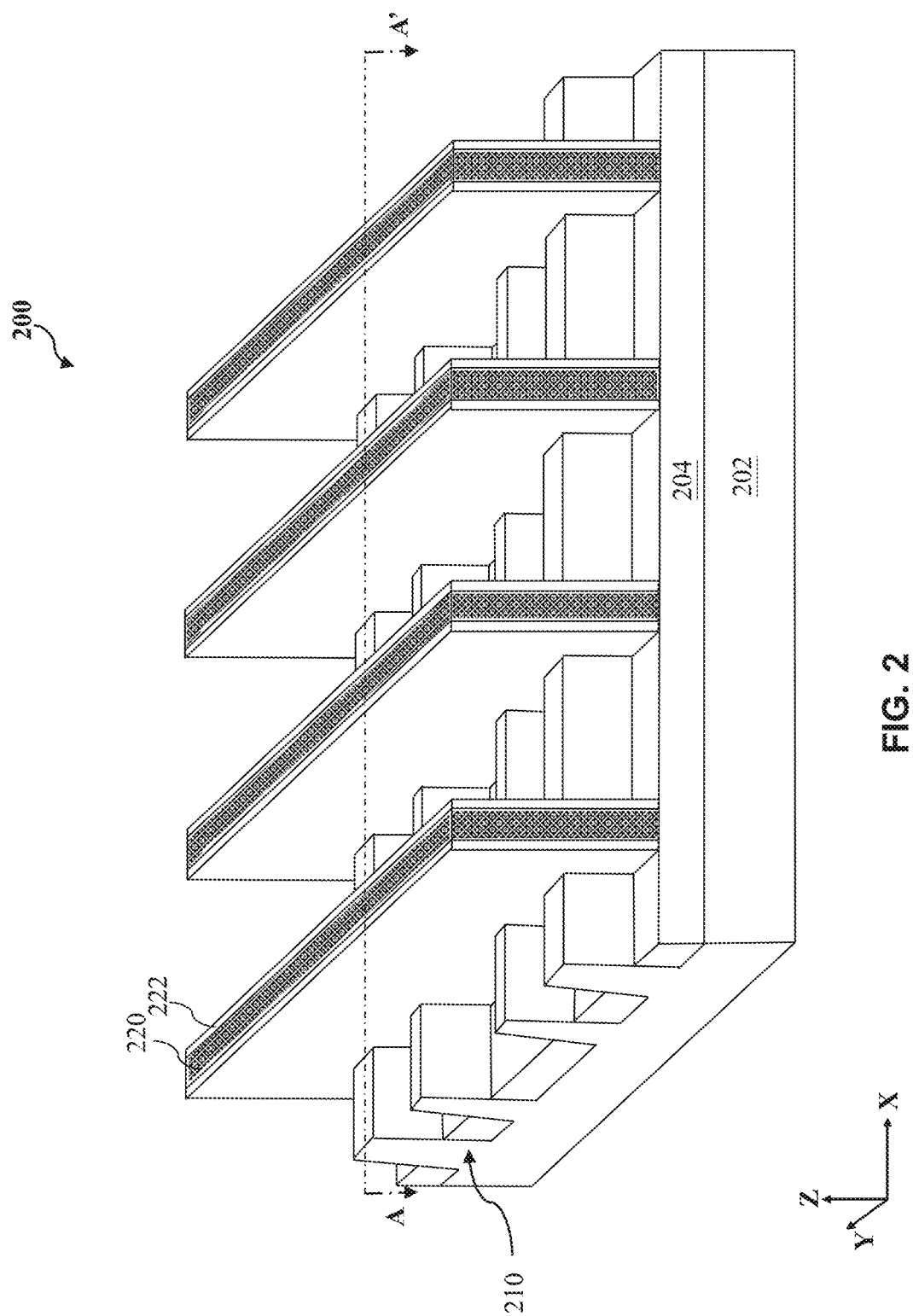
FIG. 2 illustrates a three-dimensional (3D) perspective view of a workpiece undergoing various stages of operations in the method of FIG. 1 in accordance with one or more aspects of the disclosure.
Figure 3:
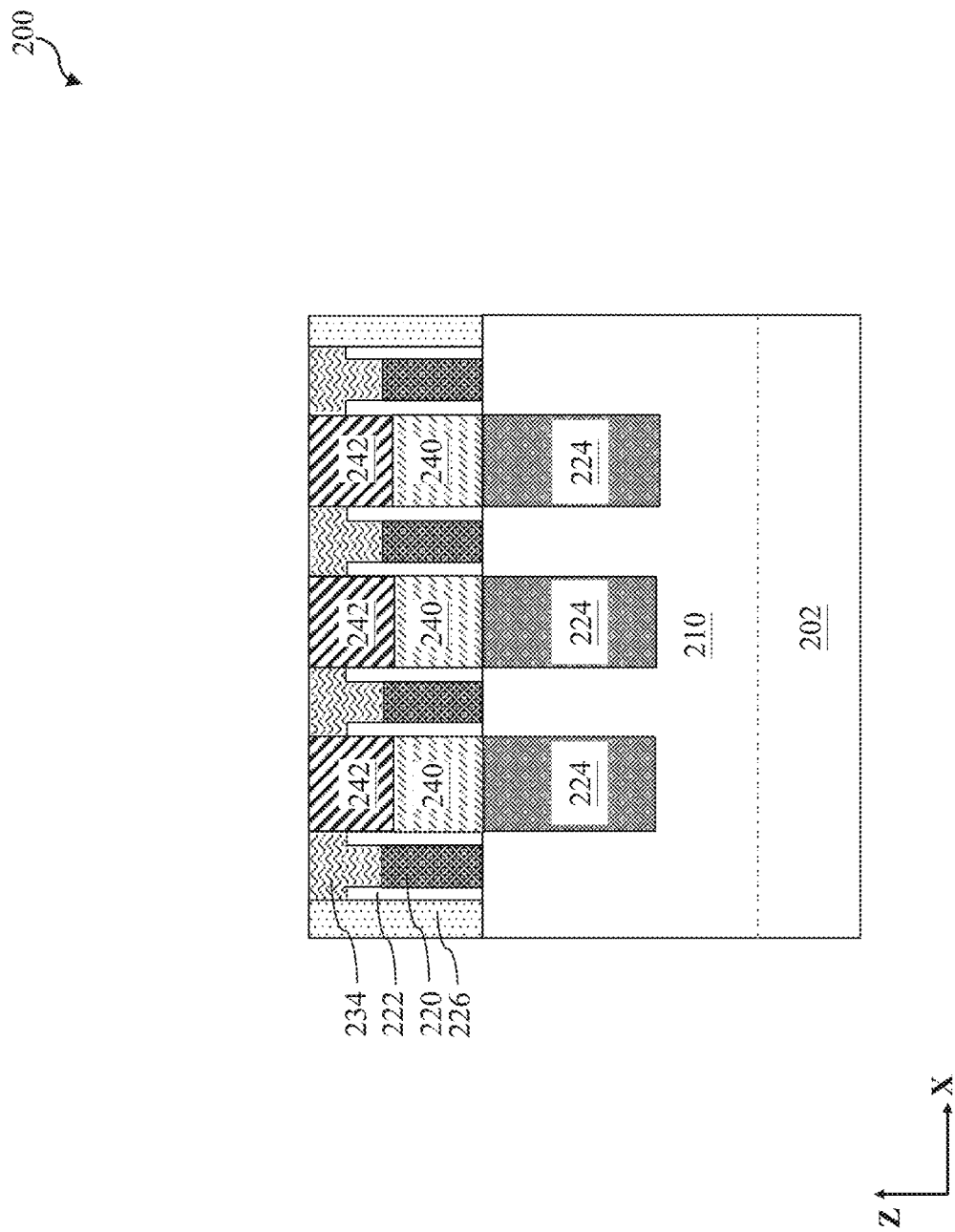
FIGS. 3-14 illustrate fragmentary cross-sectional views of a portion of the workpiece undergoing various stages of operations in the method of FIG. 1 in accordance with one or more aspects of the present disclosure.

Referring to FIGS. 1-3, method 100 includes a block 12 where a workpiece 200 is provided. Because a semiconductor structure will be formed from the workpiece 200, workpiece 200 may be referred to as semiconductor device 200 or semiconductor structure 200 in suitable context. Referring to the example of FIGS. 2-3, the semiconductor device 200 includes a substrate 202 and various features formed thereon. In the depicted embodiment, the substrate 202 includes silicon. Alternatively or additionally, the substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 202 includes one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. The substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron (B), gallium (Ga), other p-type dopant, or combinations thereof. N-type doped regions (for example, n-type wells) include n-type dopants, such as phosphorus (P), arsenic (As), other n-type dopant, or combinations thereof. In some implementations, the substrate 202 includes doped regions formed with a combination of p-type dopants and n-type dopants. An ion implantation process, a diffusion process, and/or other suitable doping process can be performed to form the various doped regions.

As shown in FIG. 2, the workpiece 200 includes a plurality of fins (or fin elements) 210 disposed on the substrate 202. In some embodiments, the plurality of fins 210 may be formed from patterning a portion of the substrate 202. In some alternative embodiments, the plurality of fins 210 may be formed from patterning one or more epitaxial layers deposited over the substrate 202. An isolation feature 204 is formed between the plurality of the fins 210 to separate adjacent fins. In some embodiments, the isolation feature 204 may include silicon oxide, silicon nitride, silicon oxynitride, fluorine-doped silicate glass (FSG), a low-k dielectric, combinations thereof, and/or other suitable materials. In some other embodiments not explicitly shown in the figures, the semiconductor device 200 may be an MBC transistor and the active region may include at least one nanostructure of an MBC transistor. The active region may include first semiconductor layers and second semiconductors layer that are first alternatingly and epitaxially grown on the substrate 202 to form a layer stack. The first semiconductor layer and the second semiconductor layer have different compositions (e.g., Si, SiGe). The semiconductor layer stack having first semiconductor nanostructures and second semiconductor nanostructures is then patterned to form fin-shape stacks of nanostructures. The second semiconductor layers in the channel regions of fin-shape stacks are then selectively removed to release the first semiconductor layers into suspended nanostructures to forming a channel region.

The workpiece 200 includes gate structures 220 disposed over channel regions of the fins 210. In the embodiments represented in FIG. 2, the gate structures 220 wrap over channel regions of the fins 210. While not explicitly shown in the figures, each of the gate structures 220 includes a gate dielectric layer and a gate electrode over the gate dielectric. The gate dielectric layer may include an interfacial layer and a high-k dielectric layer. In some instances, the interfacial layer may include silicon oxide. The high-k dielectric layer is formed of dielectric materials having a high dielectric constant, for example, greater than a dielectric constant of silicon oxide ($k \approx 3.9$). Exemplary high-k dielectric materials for the high-k dielectric layer include hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. In one embodiment, the high-k dielectric layer is formed of hafnium oxide (HfO). The gate electrode may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum (Al), copper (Cu), tungsten (W), ruthenium (Ru), titanium (Ti), a suitable metal, or a combination thereof.

Sidewalls of the gate structures 220 are lined with gate spacers 222. In some embodiments, the gate spacer 222 may include silicon carbonitride, silicon oxycarbide, silicon oxycarbonitride, or silicon nitride. In some embodiments, a gate replacement or a gate last process may be used to form the gate structures 220. In an example gate last process, dummy gate stacks are formed over channel regions of the fins 210. The gate spacers 222 are then deposited over the workpiece 200, including over sidewalls of the dummy gate stacks. An anisotropic etch process is then performed to recess source/drain regions to form source/drain trenches, leaving behind the gate spacers 222 extending along sidewalls of the dummy gate stacks. After formation of the source/drain trenches, source/drain features (such as the source/drain features 224 in FIG. 3) are deposited into the source/drain trenches in the source/drain regions. The source/drain features 224 may be formed vapor-phase epitaxy (VPE), ultra-high vacuum CVD (UHV-CVD), LPCVD, and/or PECVD), molecular beam epitaxy (MBE), or other suitable epitaxy processes, or combinations thereof. The source/drain features 224 may also be referred to as epitaxial features.

Depending on the design of the semiconductor device 200, source/drain features 224 may be n-type or p-type. When the source/drain features 224 are n-type, they may include silicon (Si) doped with an n-type dopant, such as phosphorus (P) or arsenic (As). When the source/drain features 224 are p-type, they may include silicon germanium (SiGe) doped with a p-type dopant, such as boron (B) or gallium (Ga). In some implementations, annealing processes may be performed to activate dopants in source/drain features 224 of the semiconductor device 200. A bottom interlayer dielectric (ILD) layer 226 (shown in FIG. 3) is formed over the workpiece 200. The bottom ILD layer 226 may include, $SiO_2$, SiN, SiON, tetraethylorthosilicate (TEOS) formed oxide, phosphosilicate glass (PSG), borophosphosilicate glass (BPSG), low-k dielectric material (k<3.9), other suitable dielectric material, or combinations thereof. The bottom ILD layer 226 may be deposited using atomic layer deposition (ALD), plasma-enhanced ALD (PEALD), plasma-enhanced chemical vapor deposition (PECVD), and/or other suitable deposition processes. The workpiece 200 is then planarized using a chemical mechanical polishing (CMP) process to expose the dummy gate stacks. The dummy gate stacks are then removed and replaced with the gate structures 220, the composition of which has been described above.

With reference to FIG. 3, the workpiece 200 includes a first self-aligned contact dielectric (SAC) layer 234 formed over the gate structure 220 and the gate spacer 222, a source/drain contact 240 formed over the source/drain feature 224, and a second self-aligned contact dielectric (SAC) layer 242 formed over the source/drain contact 240. The formation of the first SAC layer 234 may include multiple processes. For example, the gate structure 220 and the gate spacers 222 are selectively and partially etched to form a recess. In some embodiments, the etching process is selective such that it etches the gate structure 220 and the gate spacers 222 without substantially etching the bottom ILD layer 226. The etching process may include a dry etch, a wet etch, a combination thereof, or other suitable etching process. In some implementations, the etching process may include at least one component that etches the gate structure at a greater rate than it etches the gate spacer such that a top surface of the gate structure 220 is lower than a top surface of the gate spacer 222 as shown in FIG. 3. The first SAC layer 234 may be then formed in the recess. A thickness of the first SAC layer 234 may be between about 1 nm and about 30 nm. In an embodiment, the first SAC layer 234 is silicon nitride. Other exemplary compositions of the first SAC layer 234 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon oxycarbonitride, silicon, zirconium nitride, silicon carbonitride or combinations thereof.

As depicted in FIG. 3, S/D contacts 240 are formed over the S/D features 224. The S/D contacts 240 include conductive materials such as Al, W, Cu, or combinations thereof. A silicide layer may be formed between the epitaxial S/D feature 224 and the S/D contact 240. Formation of the S/D contacts 240 may involve one or more processes such as lithography, etching, deposition, annealing, and/or planarization processes. In some implementations, source/drain contacts 240 are MEOL features that interconnect FEOL features (for example, epitaxial source/drain features 224) to BEOL features (for example, the to-be-formed contact via 258 shown in FIG. 6, the to-be-formed metal line 276 shown in FIG. 11), thereby electrically and/or physically coupling FEOL features to BEOL features. The second SAC layer 242 is formed on the S/D contact 240. The material and the processes of forming the second SAC layer 242 may be in a way similar to those used to form the first SAC layer 234. A thickness of the second SAC layer 242 may be between about 1 nm and about 30 nm.

Figure 4:
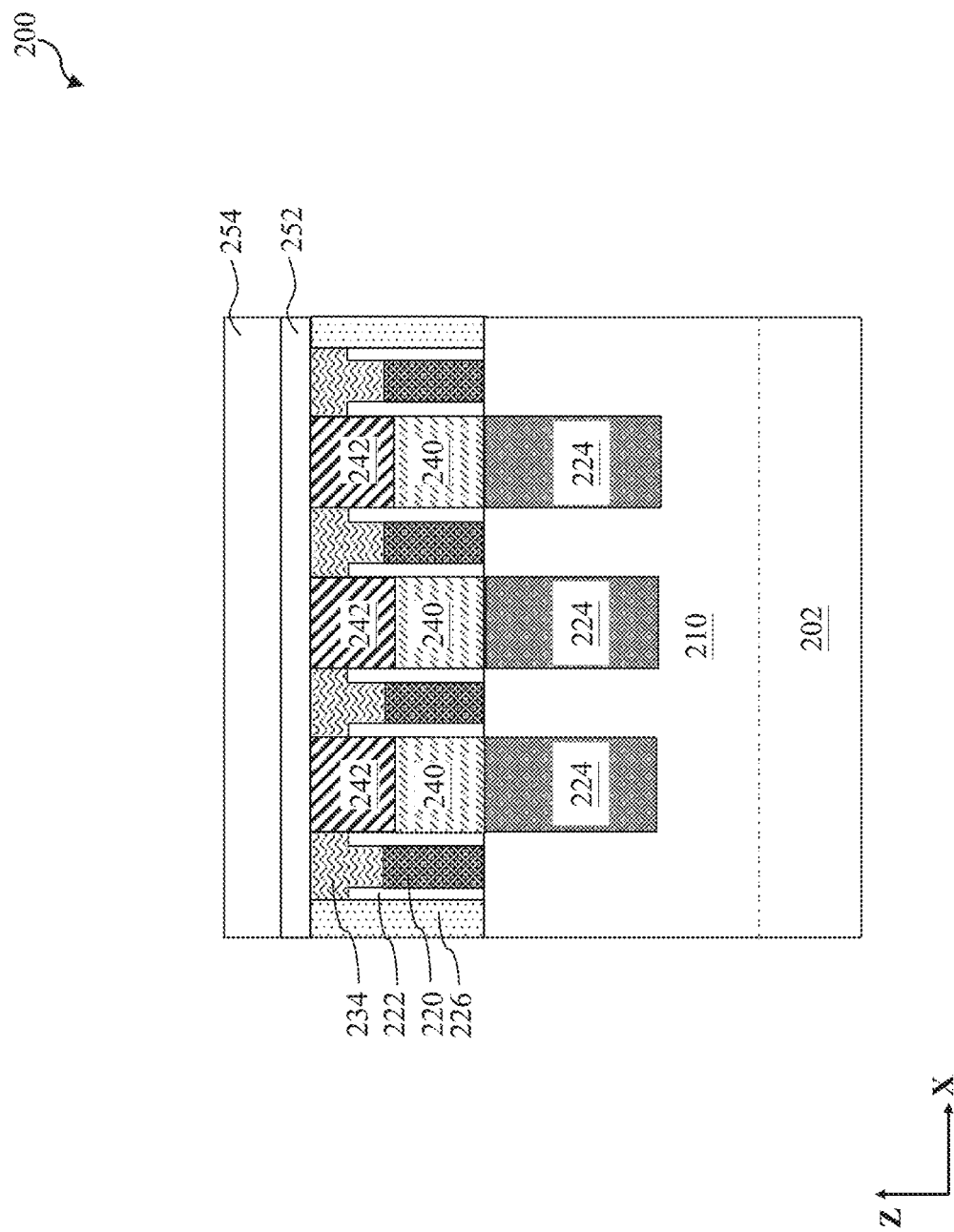
Figure 5:
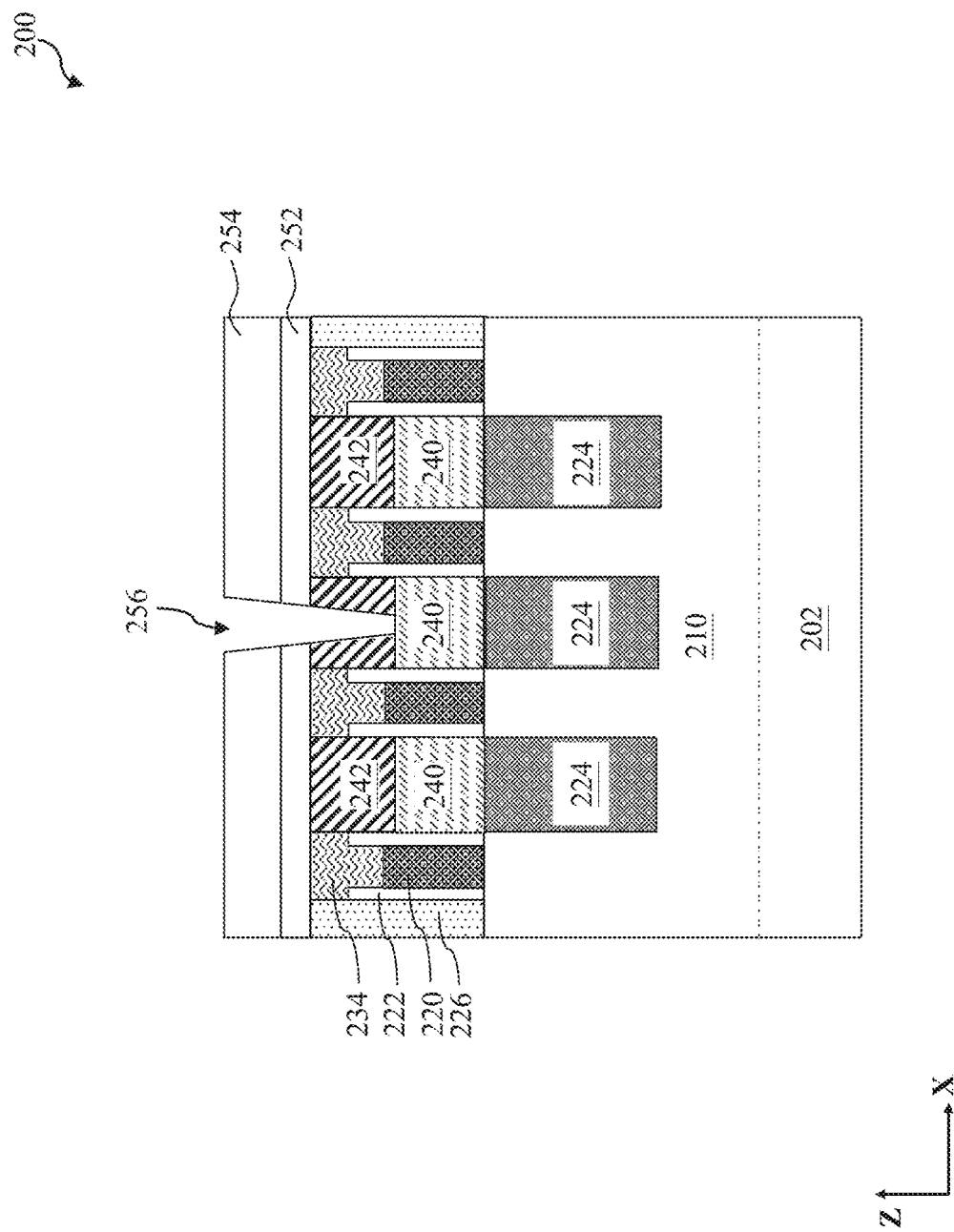

Referring to FIG. 1 and FIGS. 4-6, the method 100 includes a block 14 where a first ILD layer is formed over the workpiece 200 and a block 16 where a S/D contact via is formed over the S/D feature 224. With reference to FIG. 4, a capping layer 252 and a first ILD layer 254 are formed over the workpiece 200. Because the capping layer 252 is disposed over top surfaces of the gate structures 220, the capping layer 252 may also be referred to as gate-top capping layer 252 or a gate-top etch stop layer 252. In some embodiments, the capping layer 252 may include silicon carbonitride (SiCN), silicon nitride (SiN), and/or or other suitable materials. In some instances, the first ILD layer 254 includes a thickness along the Z direction and the thickness is between about 11 nm and about 20 nm. The first ILD layer 254 may include an oxide material, such as undoped silica glass (USG), or other suitable material(s). As illustrated in FIG. 5, one or more openings (such as opening 256) are formed to expose surfaces of the S/D contacts 240. In some embodiments, the opening 256 may be formed by penetrating the first ILD layer 254, the capping layer 252, and the second SAC layer 242 to expose a portion of the top surface of the S/D contact 240 (e.g., drain contact). Another opening (not shown) may be formed similarly to expose a top surface of another S/D contact 240 (e.g., source contact). In some implementations, one or more rinse or cleaning processes may be performed to clean the exposed S/D contacts 240, such as the sidewalls through the second SAC layer 242 and the exposed portions of the S/D contacts 240.

Figure 6:
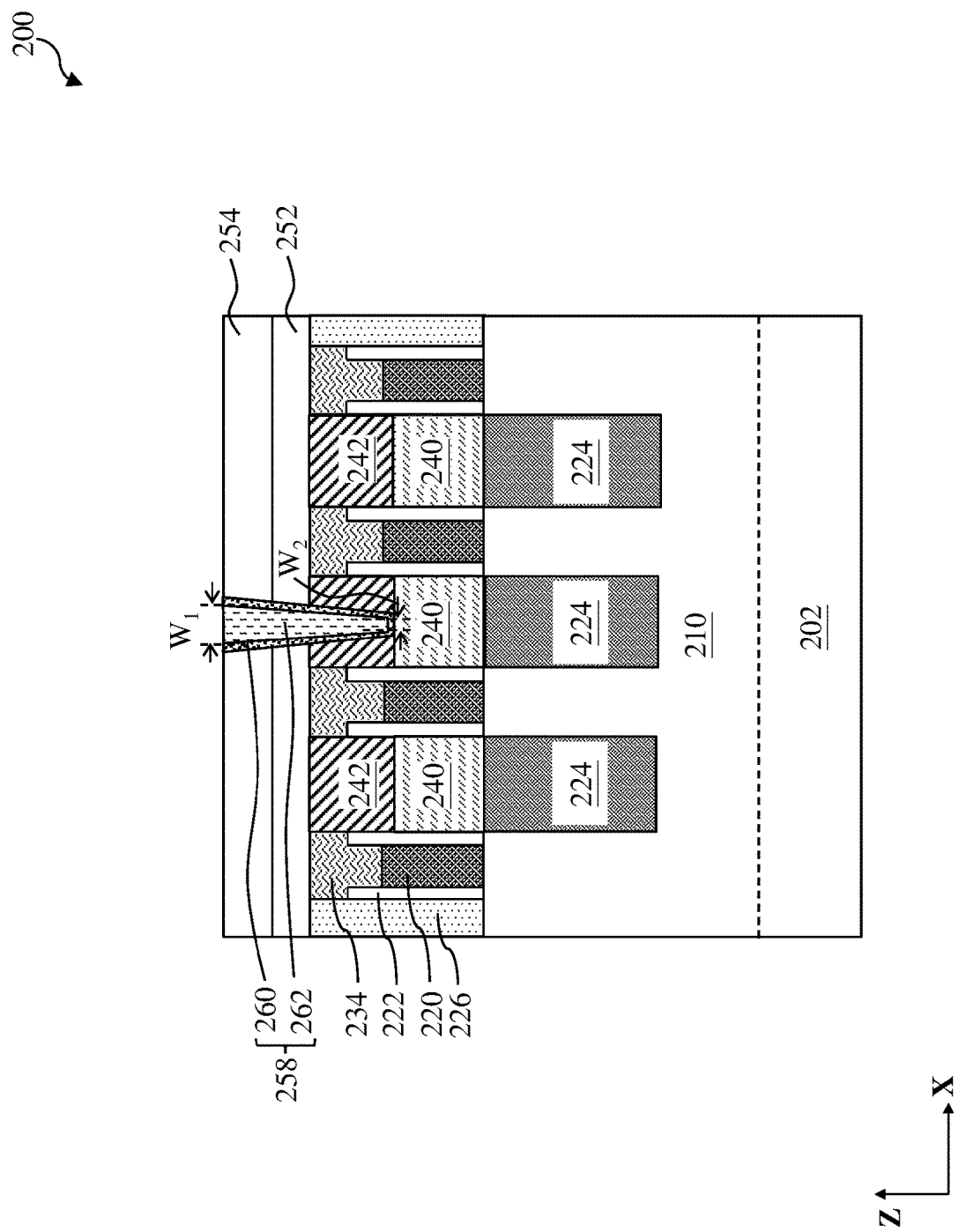

As depicted in FIG. 6, one or more S/D contact vias (such as contact via 258) are formed in the openings (such as opening 256), respectively, to fill the openings (e.g., the opening 256). Similar processes may be performed to form another contact via that electrically contacts with the source contact for the source feature of the transistor. In this depicted example, to form the contact via 258, a glue layer 260 is first conformally deposited over the first ILD layer 254 and into the opening 256 using a suitable deposition technique, such as an ALD process, a PVD process or a CVD process, and then a metal fill layer 262 is deposited over the glue layer 260 using a suitable deposition technique, such as an ALD process, a PVD process or a CVD process. The glue layer 260 may be formed of tungsten, ruthenium, cobalt, copper, molybdenum, titanium nitride, or tantalum nitride. In one embodiment, the glue layer 260 includes tantalum nitride. A thickness of the glue layer 260 may be between about 0.5 nm and about 10 nm. In some embodiments, the glue layer may only include a sidewall portion formed over the sidewall surfaces of the opening 256. In some embodiments, the glue layer may only include a flat portion formed on the bottom surface of the opening 256. The metal fill layer 262 may be formed of tungsten, ruthenium, cobalt, copper, molybdenum, aluminum, or an alloy thereof. In one embodiment, the metal fill layer 262 for the contact via 258 may include cobalt. In some embodiments, a width $W_2$ along the X direction of the bottommost portion of the metal fill layer 262 may be different from (e.g., smaller than) a width $W_1$ (along the X direction) of the topmost portion of the metal fill layer 262. For example, $W_1$ may be between about 2 nm and about 20 nm and $W_2$ may be between about 1 nm and about 19 nm.

Figure 7:
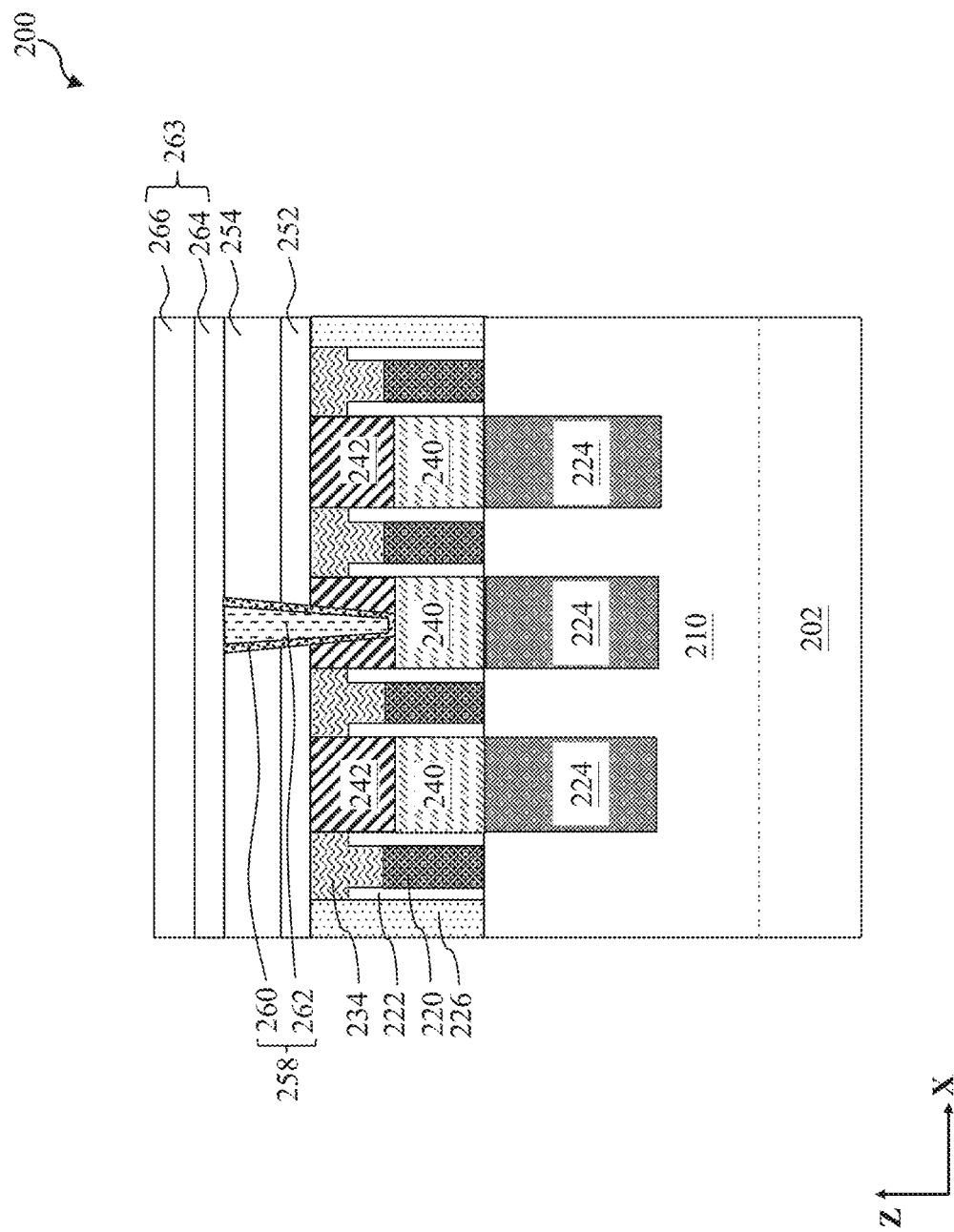
Figure 8:
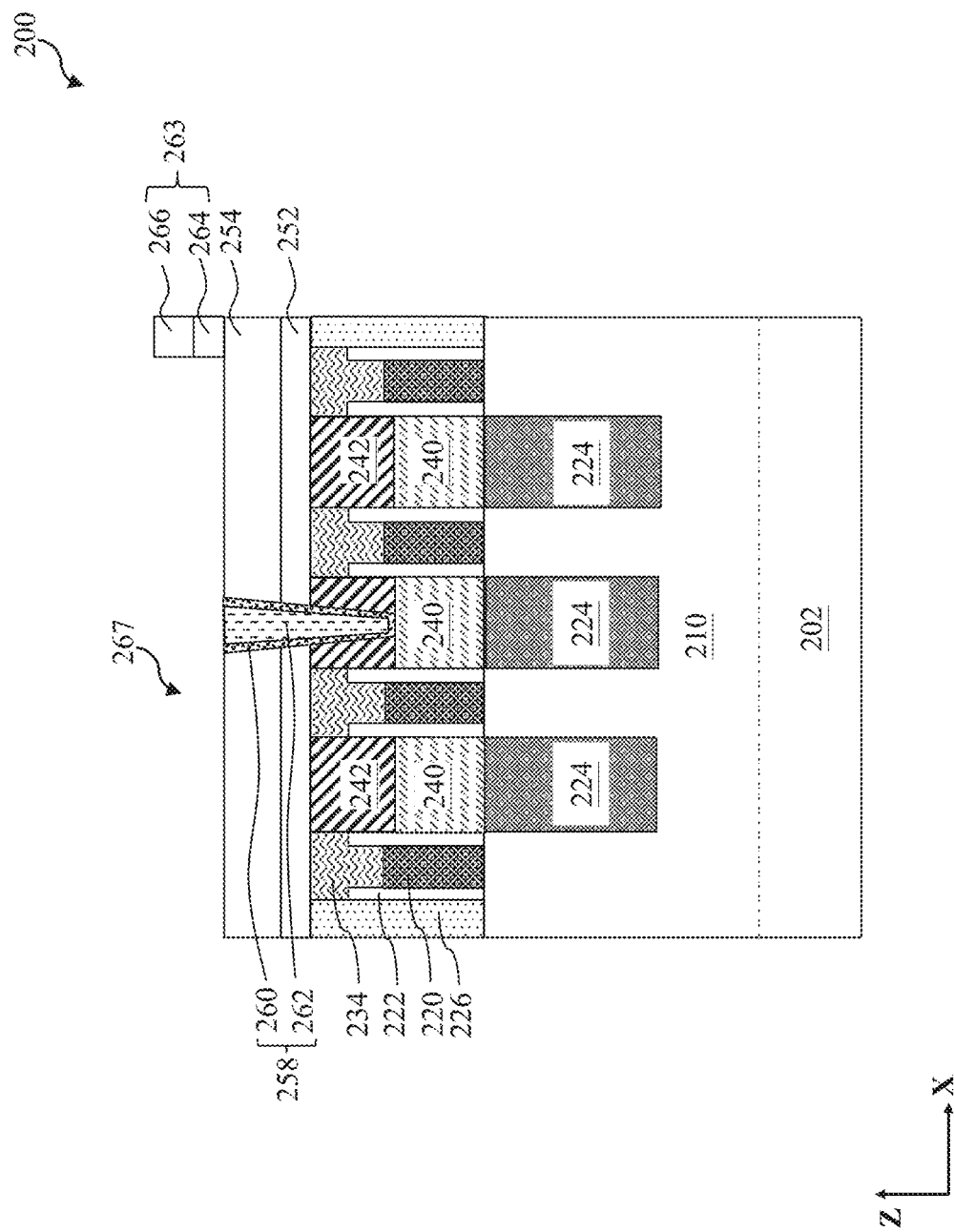

Referring to FIG. 1 and FIGS. 7-8, the method 100 includes a block 18 where a patterned etch stop structure is formed over the contact via 258. As shown in FIG. 7, an etch stop structure 263 is formed over the substrate. The etch stop structure 263 may be include one or more etch stop layers. When the etch stop structure 263 is a single layer, it may be formed of a nitrogen-containing dielectric material, such as silicon nitride or silicon carbonitride. In some implementations, a total thickness of the etch stop structure 263 may be between about 2 nm and about 60 nm. When the etch stop structure 263 is multi-layer, as shown in FIG. 7, the etch stop structure 263 may include a first etch stop layer (ESL) 264 and a second ESL 266 formed on the first ESL 264. With respect to an etch process, the second ESL 266 may have an etch rate that is different from that of the first ESL 264. This difference in etch rate allows detection of an etch end point. The first ESL 264 and the second ESL 266 may be formed of SiO, SiN, SiCN, SiOC, SiOCN, ZrSi, ZrAlO, TiO, $Ta_2O_3$, $Ta_2O_5$, $ZrO_2$, LaO, ZrN, ZnO, $HfO_2$, LaO, AlO, AlON, $Y_2O_3$, TaCN. In some embodiments, the first ESL 264 may be a nitrogen-containing layer and the second ESL 266 may be metal oxide layer. In some embodiments, a thickness of the first ESL 264 is between about 1 nm and about 30 nm and a thickness of the second ESL 266 is between about 1 nm and about 30 nm. With reference to FIG. 8, the etch stop structure 263 is patterned to form a metal line opening 267 for forming metal lines. The formation of the patterned etch stop structure 263 may involve multiple processes such as lithography, etching, and/or cleaning. As shown in FIG. 8, the top surface of the contact via 258 and a portion of the top surface of first ILD layer 254 are exposed in the metal line opening 267.

Figure 9:
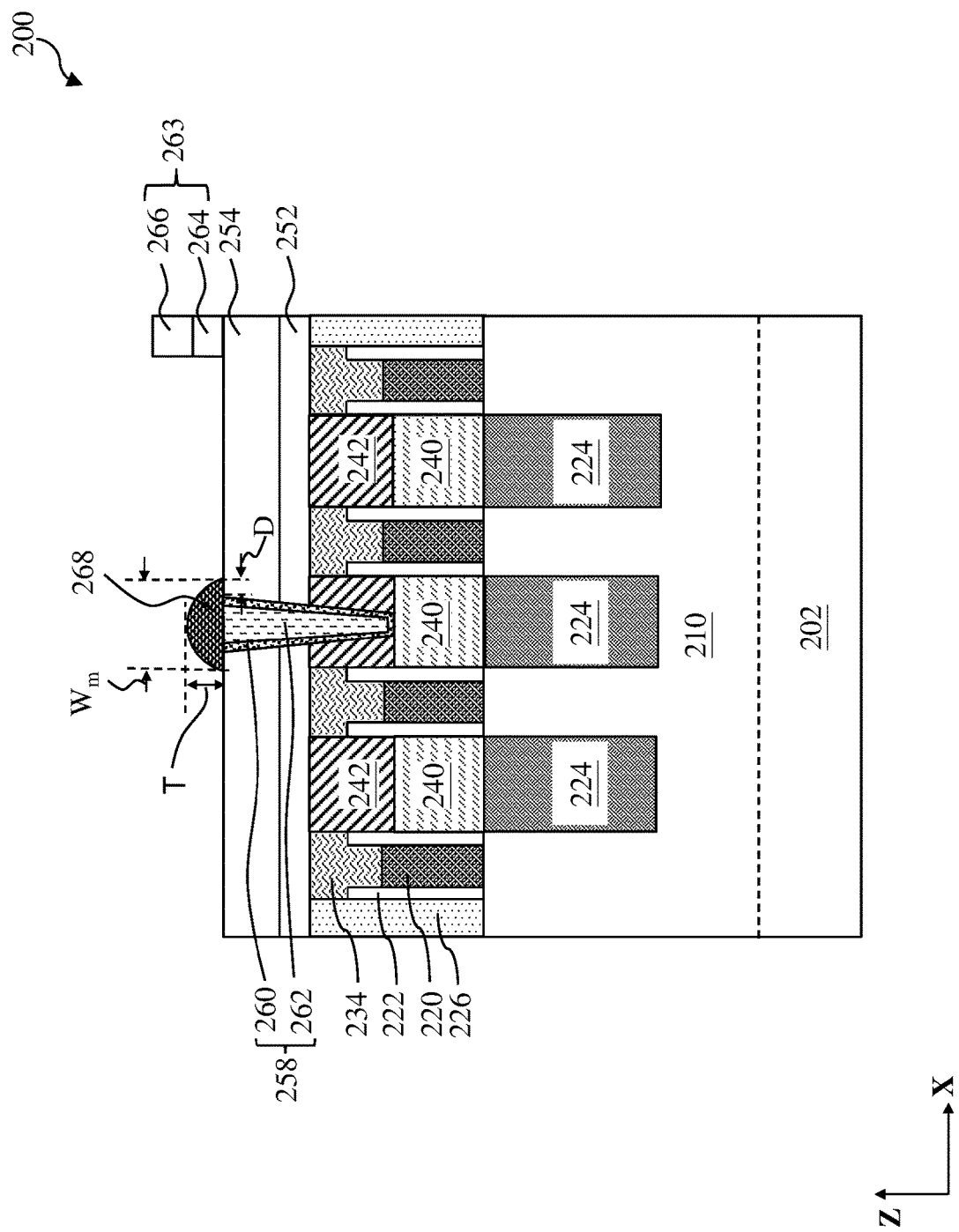

Referring to FIG. 1 and FIG. 9, the method 100 includes a block 20 where a metal feature is selectively formed over the S/D contact via 258 and in the metal line opening 267. As shown in FIG. 9, a metal feature 268 is selectively formed over the contact via 258 and is spaced apart from the source/drain contact 240 by the second SAC layer 242, and the capping layer 252, and the first ILD layer 254. The metal feature 268 may also be referred to as a metal cap 268 or a conductive cap feature 268 and is formed of a metal different from that of the first metal fill layer 262. For example, the metal feature 268 may include tungsten, ruthenium, cobalt, copper, molybdenum, or other refractory metals. In some embodiments, a selective deposition process may be implemented such that the metal feature 268 is selectively formed on and self-aligned with the contact via. A thickness T of the metal feature 268 may be between about 1 nm and about 30 nm. If the thickness T is greater than 30 nm, a corresponding manufacturing cost (e.g., cost on the materials for forming the metal feature 268 and/or even materials for forming the to-be-formed metal line 276 in the MLI feature) and time consumed on the formation of the metal feature 268 would be increased. If the thickness T is less than 1 nm, the metal feature 268 may be insufficient to reduce or substantially prevent the electromigration between the contact via 258 and the to-be-formed metal line 276 (shown in FIG. 11). The deposition process may include an ALD process, a CVD process, other suitable methods, or combinations thereof. In this illustrated example, by controlling the deposition process, the metal feature 268 is formed to cover not only the contact via 258 but also a small portion of the top surface of the first ILD layer 254 around the contact via 258 to seal the interface between the contact via 258 and the first ILD layer 254. The coverage of the metal feature 268 on the small portion of the first ILD layer 254 may be a result of an overgrowth of the metal feature 268 and may further improve device reliability and reduce contact resistance. Along the Z direction, the top surface of the contact via 258 may have, for example, a circular shape, an oval shape, a racetrack shape, a square shape, or a rectangular shape. The metal feature 268 may track the shape of the top surface of the contact via 258 and a distance D between the edge of the metal feature 268 and the edge of the contact via 258 may be between about 3% $W_1$ ($W_1$ is shown in FIG. 6) and about 25% $W_1$, for example. If the distance D is greater than 25% $W_1$, a parasitic resistance associated with the to-be-formed metal line 276 may be substantially increased. If the distance D is less than 3% $W_1$, the interfacial seam between the contact via 258 and the first ILD layer 254 may not be fully covered and thus disadvantageously reducing the effectiveness of blocking the electro-migration paths therebetween. In some embodiments, a width $W_m$ (along the X direction) of the metal feature 268 may be between about 3 nm and about 25 nm. The width $W_m$ may also be a diameter of the metal feature 268 when the metal feature 268 has a circular shape.

In exemplary embodiments, the deposition process of forming the metal feature 268 may include an ALD process that sequentially exposes the top surface of the S/D contact via 258 to two different gaseous precursors in a cyclic manner, i.e., alternating application of a first gaseous precursor and a second gaseous precursor to the top surface of the contact via 258. The first gaseous precursor may comprise a compound including a conductive element, such as W, Co, Cu, or combinations thereof, and a halogen, such as chlorine (Cl) or fluorine (F). In exemplary embodiments, the first gaseous precursor may be tungsten chloride ($WCl_5$), tungsten fluoride ($WF_6$), or other suitable materials. The second gaseous precursor comprises elements such as silicon (Si) and hydrogen (H). Examples of the second gaseous precursor include hydrogen ($H_2$) and silane ($SiH_4$). In a specific embodiment, the metal feature 268 includes tungsten, the first gaseous precursor includes $WF_6$, and the second gaseous precursor includes $H_2$. The deposition process is implemented at a temperature ranging between about 100° C. and about 550° C. with a processing pressure ranging between about 20 mTorr and 1000 mTorr. In some embodiments, the deposition process may be carried out for about 180 seconds to about 2000 seconds. In some embodiments, a shape of the metal feature 268 may include a convex top surface.

Figure 10:
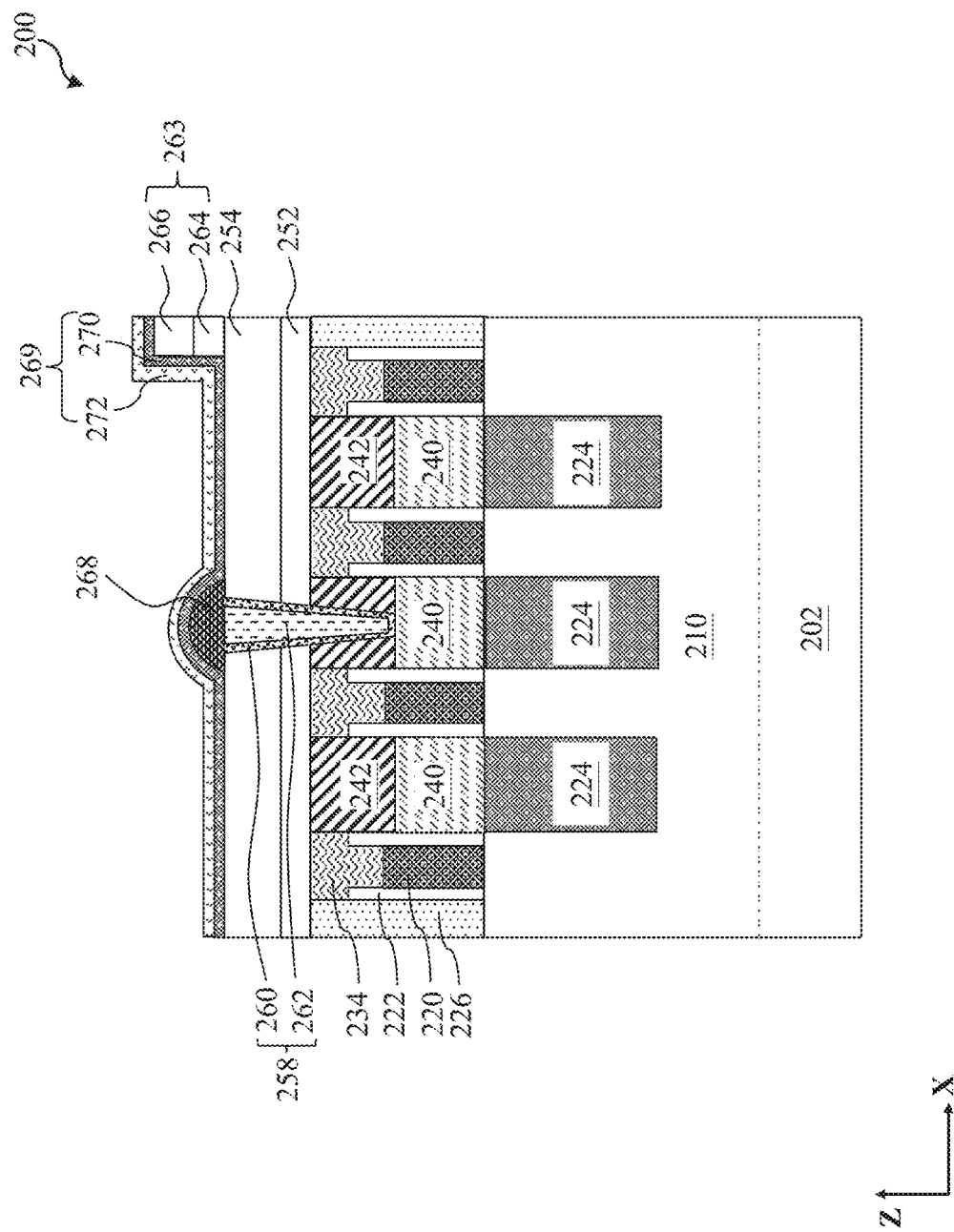
Figure 11:
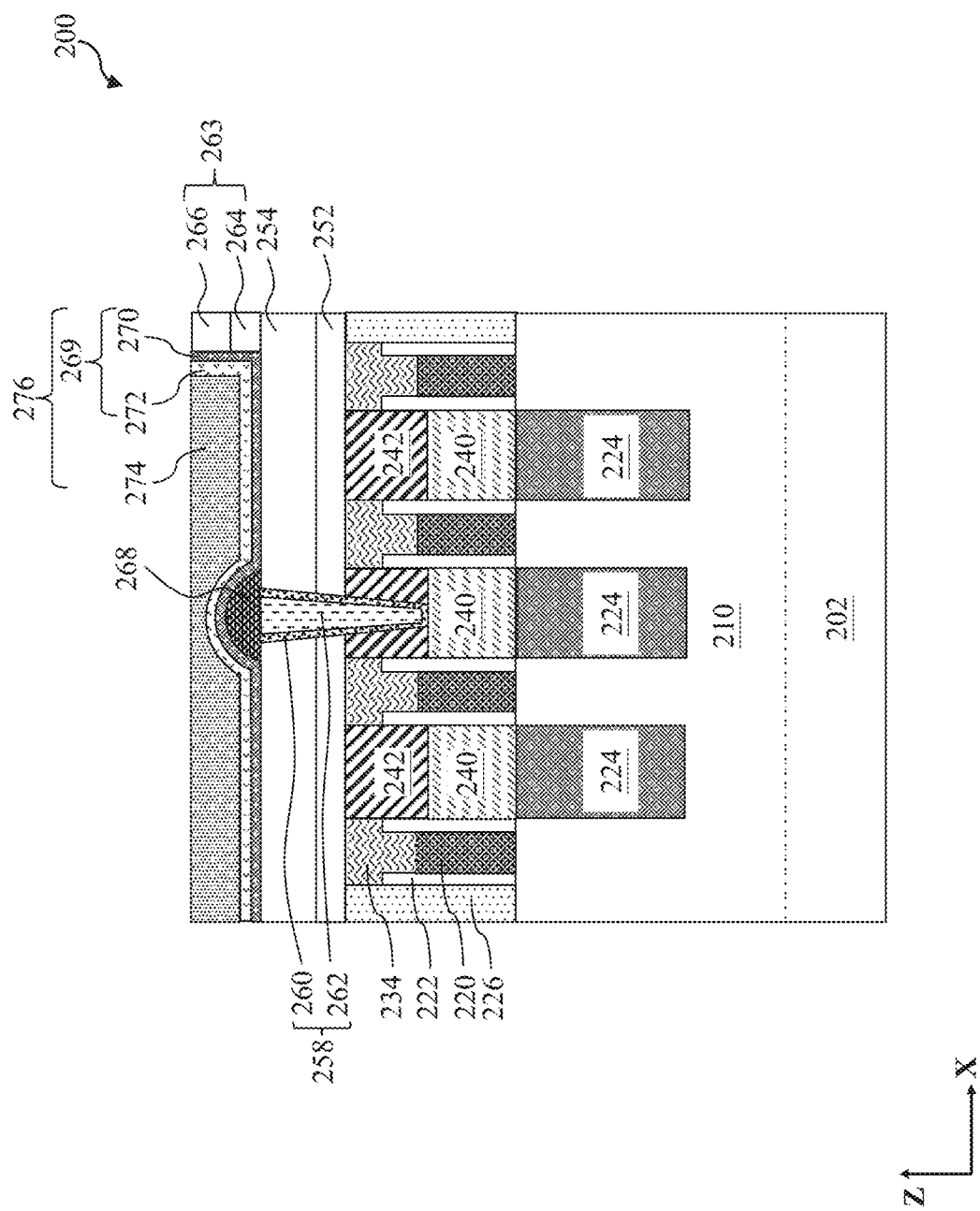

Referring to FIG. 1 and FIGS. 10-11, the method 100 includes a block 22 where a metal line is formed over the substrate 202 and fills the metal line opening 267. As illustrated in FIG. 10, a barrier structure 269 is formed over the metal cap 268. The barrier structure 269 directly contacts both the metal cap 268 and the first ILD layer 254. In other words, the barrier structure 269 not only covers the top surface of the metal cap 268 but also cover a portion of the top surface of the first ILD layer 254. As discussed above, the shape of the metal cap 268 may include a convex top surface, thus the barrier structure 269 includes a concave bottom surface. The barrier structure 269 may be a single-layer structure or may include multiple layers and may be formed using a suitable deposition technique, such as an ALD process, a PVD process or a CVD process. When the barrier structure 269 is a single-layer structure, a thickness of the barrier structure 269 may be between about 1 nm and about 60 nm. For example, a thickness of the barrier structure may be between about 5 nm and 20 nm. In this depicted example, the barrier structure 269 includes a first barrier layer 270 and a second barrier layer 272. For example, the first barrier layer 270 includes a material that prevents metal diffusion from the metal fill layer 274 (shown in FIG. 11) into dielectric layer (e.g., the first ILD layer 254 and ESL structure 263) and promotes adhesion between the metal fill layer 274 and the dielectric layer, and the second barrier layer 272 includes a material that promotes adhesion between the first barrier layer 270 and the metal fill layer 274.

The first barrier layer 270 is conformally deposited to have a generally uniform thickness over the top surface of the workpiece 200 (e.g., having substantially the same thickness on the surfaces of the metal cap 268 and the patterned ESL structure 263). A thickness of the first barrier layer 270 may be between about 1 nm and about 30 nm. The first barrier layer 270 may be formed of tungsten, ruthenium, cobalt, copper, molybdenum, titanium nitride, or tantalum nitride, and different from the material of forming the metal cap 268. In some embodiments, the resistivity of the material of the metal cap 268 is less than the resistivity of the material of the first barrier layer 270. The second barrier layer 272 is conformally deposited to have a generally uniform thickness over the surface of the first barrier layer 270 (e.g., having substantially the same thickness on top and sidewall surfaces of the first barrier layer 270). A thickness of the second barrier layer 272 may be between about 1 nm and about 30 nm. The second barrier layer 272 may be formed of tungsten, ruthenium, cobalt, copper, molybdenum, titanium nitride, or tantalum nitride and different from the material of forming the first barrier layer 270. In some embodiments, the resistivity of the material of the metal cap 268 is less than the resistivity of the material of the second barrier layer 272. Although the second barrier layer 272 is conformally deposited over the first barrier layer 270 in this depicted example, in other embodiments, the second barrier layer 272 may only include a bottom portion that is formed on the top surface of flat portion of the first barrier layer 270. In some embodiments, the second barrier layer 272 may only include a sidewall portion that is only formed on sidewall surfaces of the first barrier layer 270.

Figure 12:
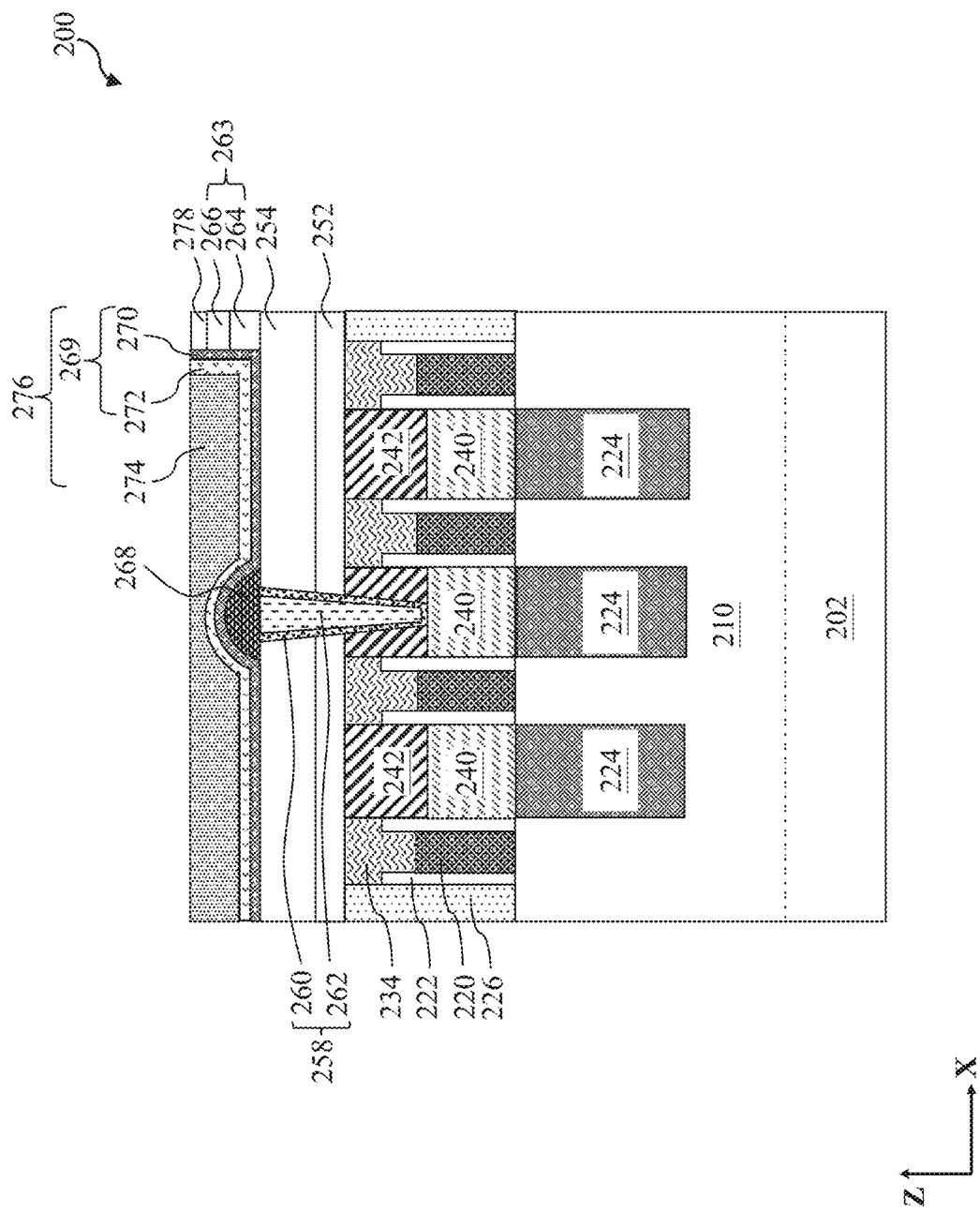

With reference to FIG. 11, a metal fill layer 274 is formed over the barrier structure 269. The formation of the metal fill layer 274 may involve multiple processes such as deposition, planarization processes. For example, the metal fill layer 274 is deposited over the barrier structure 269 using a suitable deposition technique, such as an ALD process, a PVD process or a CVD process. The metal fill layer 274 may be formed of tungsten, ruthenium, cobalt, copper, molybdenum, or an alloy thereof. The material of forming the metal fill layer 274 is different from the material of forming the metal cap 268. In one embodiment, the metal fill layer 274 is formed of ruthenium. A thickness of the metal fill layer 274 may be between about 1 nm and about 50 nm. The combination of the barrier structure 269 and the metal fill layer 274 may be referred as to metal line 276. In some embodiments, depending on the total thickness of the ESL structure 263, another ILD layer 278 (as shown in FIG. 12) may be optionally formed over the ESL structure 263 before the forming of the opening 267 and the metal cap 268. The composition and processes of forming the ILD layer 278 may be similar to the composition and processes of forming the first ILD layer 254.

As discussed above, with the interconnect structures getting smaller, the barrier structure 269 is getting thinner. The thinned barrier structure 269 may not have a sufficient thickness to retard metal migration between the metal line 276 and the contact via 258. The metal cap 268, which spaces apart the metal line 276 from the contact via 258, would advantageously reduce and even substantially eliminate the interdiffusion and metal migration between the metal line 276 and the contact via 258. In other words, the electron transportation path between the metal line 276 and the contact via 258 is substantially blocked by the metal cap 268. Moreover, as the overgrowth of the metal cap 268 covers the interfacial seam between the contact via 258 and the first ILD layer 254, the metal cap 268 may reduce possible electro-migration paths. In some embodiments, the contact via 258 is formed of a first material and the metal line 276 is formed of a second material different from the first material. To reduce the interdiffusion and metal migration between the metal line 276 and the contact via 258, the metal cap 268, selectively formed to space apart the metal line 276 from the contact via 258, is formed of a third material different from the first material and the second material. In some embodiments, the material of the metal cap 268 may be selected such that a solubility between the metal cap 268 and the metal line 276 and a solubility between the metal cap 268 and the contact via 258 are less than a solubility between the metal line 276 and the contact via 258. As such, the interdiffusion and metal migration between the metal line 276 and the contact via 258 may be further reduced. In some embodiments, the material of the metal cap 268 may be further selected such that the resistivity of the third material is less than the resistivity of that of the first barrier layer 270 and/or the second barrier layer 272. In one embodiment, the metal fill layer 274 is formed of ruthenium, the metal fill layer 262 is formed of cobalt, and the metal cap 268 is formed of tungsten. Since electromigration between the contact via 258 and the metal line 276 would be advantageously reduced or substantially eliminated, VBDs, TDDB and RC delay due to electromigration may also be advantageously reduced. In addition, because the convex top surface of the metal cap 268 has a greater area than the top surface of the contact via 258, implementation of the metal cap 268 of the present disclosure may reduce the contact resistance between the metal line 276 and the top surface of the contact via 258. As such, the device performance is advantageously enhanced.

Referring to FIG. 1, method 100 includes a block 24 where further processes may be performed. Such further processes may include forming further structures for interconnecting devices (e.g., the semiconductor device 200) fabricated across the semiconductor substrate 202. For example, such further processes may include deposition of an intermetal dielectric (IMD) layer, formation of metal lines, formation of power rails, and/or other suitable semiconductor device features. As discussed above, the semiconductor device 200 may include one or more transistors having one or more gate structures 220. Such further processes may include forming an interconnect structure over the gate structure 220.

Figure 13:
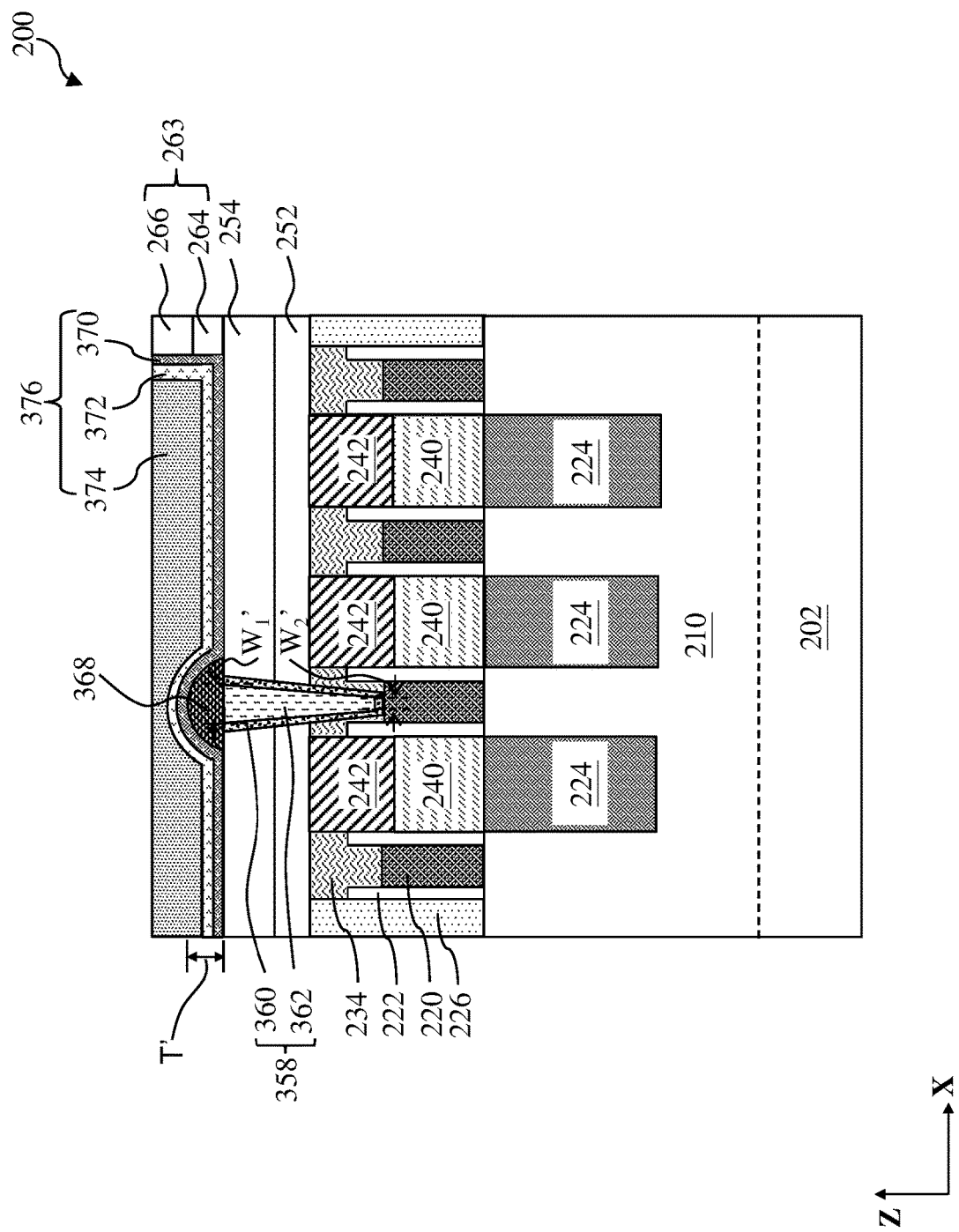

Metal caps similar to the metal cap 268 may also be applied to gate contact vias to reduce or eliminate electromigration between the contact vias and the metal lines. Reference is made to FIG. 13. A gate contact via 358 penetrates the first ILD layer 254, the capping layer 252, and the first SAC layer 234 and electrically connected to the gate structure 220. The gate contact via 358 includes a glue layer 360 and a metal fill layer 362. The glue layer 360 may be formed of tungsten, ruthenium, cobalt, copper, molybdenum, titanium nitride, or tantalum nitride. A thickness of the glue layer 360 may be between about 0.5 nm and about 10 nm. The metal fill layer 362 may be formed of tungsten, ruthenium, cobalt, copper, molybdenum, titanium nitride, or tantalum nitride. A width of the metal fill layer 362 may be between about 1 nm and about 20 nm. In some embodiments, a width W1' of the topmost portion of the metal fill layer 362 may be different from a width W2' of the bottommost portion of the metal fill layer 362. For example, W1' may be between about 2 nm and about 20 nm and is greater than W2', W2' may be between about 1 nm and about 19 nm. In this depicted example, the gate contact via 358 is formed after the formation of the S/D contact vias 258, and the gate contact via 358 may be formed of material(s) different from the S/D contact vias (e.g., the contact via 258). In other implementations, the gate contact via 358 and the S/D contact vias (e.g., the contact via 258) may be formed simultaneously and formed of same material(s).

The first ESL 264 and the second ESL 266 are deposited over the workpiece 200, including over the metal cap 368. The deposited first ESL 264 and the second ESL 266 are then patterned as described above to form the patterned ESL structure 263. The patterned ESL structure 263 includes another metal line opening (shown as filled by a metal line 376 in FIG. 13) and a top surface of the gate contact via 358 is exposed in the another metal line opening. Then, a metal cap 368 may be formed in a way similar to that used to form the metal cap 268 in FIG. 9. A thickness T' of the metal cap 368 may be between about 1 nm and about 30 nm. In some embodiments, a shape of a top surface of the metal feature 368 may include a convex shape.

After forming the metal cap 368, a metal line 376 (e.g., including barrier layers 370, 372 and a metal fill layer 374) is deposited into the another metal line opening. In some embodiments, the metal line 376 may be formed in a way similar to that used to form the metal line 276 in FIGS. 10-11. By providing the metal cap 368 which spaces apart the contact via 358 from the metal line 376, leakage path between the contact via 358 and the metal line 376 may be substantially blocked and thus electromigration between the metal line 376 and the contact via 358 may be advantageously reduced or substantially eliminated. Therefore, VBDs, TDDB and RC delay due to electromigration may also be advantageously reduced. In addition, the contact resistance at the interface between the metal line 376 and the metal cap 368 is also reduced. As such, the device performance is advantageously enhanced.

Figure 14:
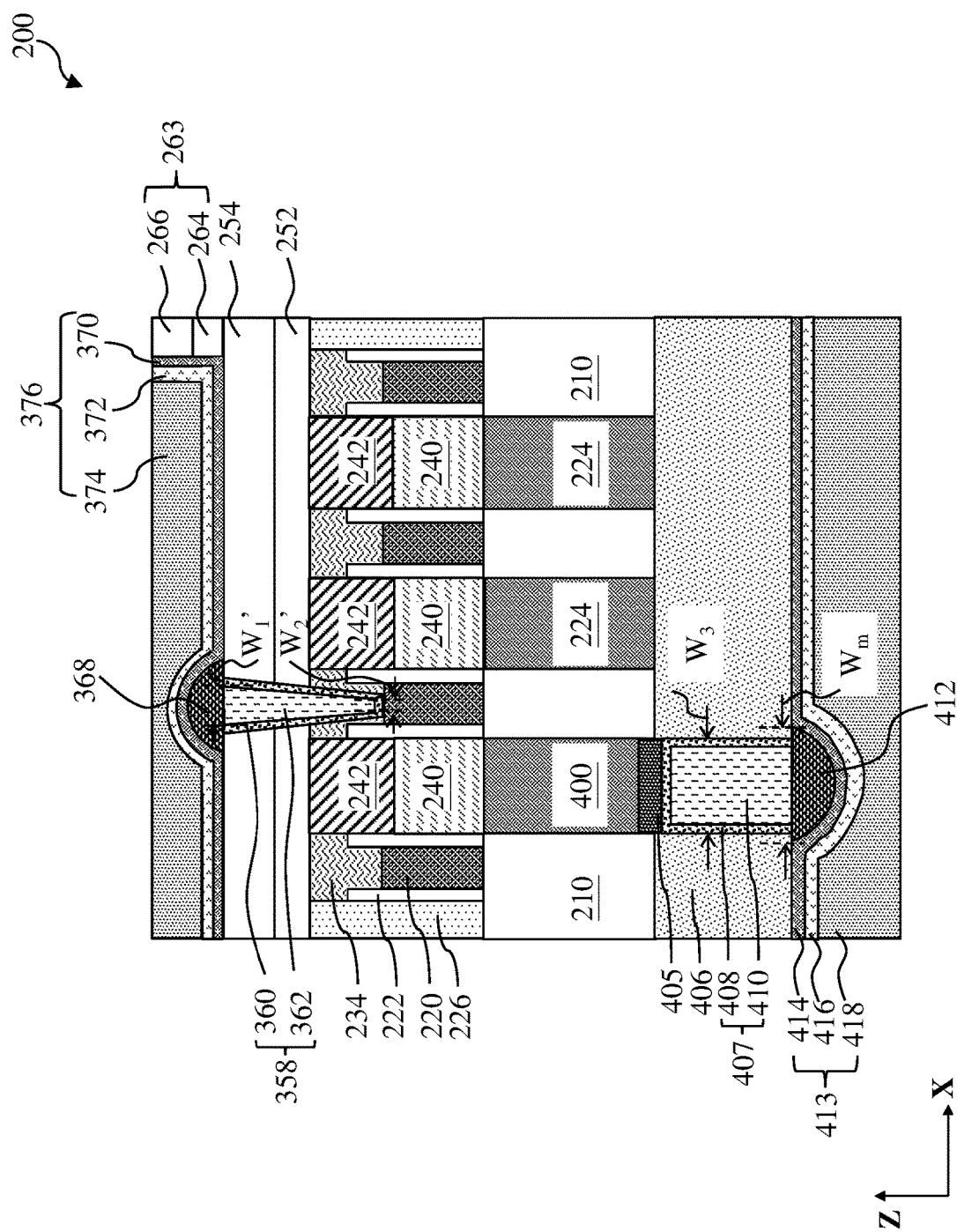

In the above example as discussed with reference to FIGS. 3-13, both the source contact via and the drain contact via of a transistor in the semiconductor device 200 are frontside contact vias. In some other embodiments, at least one of the S/D contact vias of a transistor may be a backside contact via to accommodate integrated circuits of high functional density. For example, the drain contact via may be a frontside contact via and a source contact via may be a backside contact via. The foregoing metal cap formation processes may also be used to reduce interdiffusion and metal migration between a backside source contact via and a backside power rail. As shown in FIG. 14, after the frontside interconnect structure is formed at the frontside of the workpiece 200, a backside interconnect structure would be formed at the backside of the workpiece 200. The backside processes may be performed by turning the workpiece 200 upsidedown.

The formation of the backside interconnect structure may include multiple processes. For example, at least a portion of the substrate 202 is removed from the backside of the workpiece 200. Removing at least a portion of the substrate 202 may include various steps such as a planarization process (for example, CMP) and/or an etching process (for example, wet etching, dry etching, or combinations thereof). In some embodiments, the substrate 202 may be planarized until adjacent semiconductor fin structures are no longer jointed by the substrate 202 or a portion thereof. After the backside of the workpiece 200 is polished, the bottom surface of a source feature 400 (one of the source/drain features 224) is exposed from the backside. A backside dielectric layer 406 is then deposited covering the bottom surface of the source feature 400. The backside dielectric layer 406 includes a material similar as that of the bottom ILD layer 226 or the first ILD layer 254. In some embodiments, the backside dielectric layer 406 may be formed by a deposition process (such as CVD, PVD, ALD), plating, other suitable methods, or combinations thereof. In some embodiments, before depositing the backside dielectric layer 406, additional processing of the source feature 400 such as forming a silicide region 405 at the bottom portion of the source feature 400 may be performed.

A backside contact via 407 is then formed in the backside dielectric layer 406 and directly contacts the bottom surface of the source feature 400 (or the silicide region 405). In this depicted example, the backside contact via 407 includes a glue layer 408 and a metal fill layer 410. The backside contact via 407 may be self-aligned to the source feature 400 and processes and materials of forming backside contact via 407 may be in a way similar to the formation of the frontside contact via 258 discussed with reference to FIG. 6. A width $W_3$ (along the X direction) of the backside contact via 407 may be between about 10 nm and about 25 nm and greater than $W_1$ ($W_1$ is shown in FIG. 6). As such, in some embodiments, the semiconductor device 200 (e.g., a transistor) may include two contact vias (e.g., contact via 258 and contact via 407) with different dimensions for the corresponding source feature 400 and the drain feature 224.

Then, a backside metal cap 412 is formed and electrically contacts the backside contact via 407. More specifically, the backside metal cap 412 is formed below the backside dielectric layer 406 and directly contacts the bottom surface of the backside contact via 407. The backside metal cap 412 is formed from a metal different from the metal that forms the metal fill layer 410. For example, the backside metal cap 412 may include tungsten, ruthenium, cobalt, copper molybdenum, or other refractory metals. The processes and materials of forming backside metal cap 412 may be in a way similar to the formation of the metal cap 268/368 discussed with reference to FIG. 9 and FIG. 13. For example, a selective deposition process may be implemented such that the backside metal feature 412 is substantially selectively formed below and self-aligned with the contact via 407 and is substantially absent from the surfaces of the dielectric layer 406. In some embodiments, by controlling the deposition process, the backside metal feature 412 is formed to not only cover the contact via 407 but also cover a small portion of a bottom surface of the dielectric layer 406 as discussed with reference to FIG. 9. For example, the backside metal feature 412 may track the shape of the contact via 407 and has a width Wm' ranged between about 10 nm and about 35 nm. Since the feature density at the backside of the workpiece 200 may be less than that of the frontside, the backside source contact via 407 may be fabricated to have a width W3 (along X direction) greater than W1 to provide better electricity connection. As the backside metal feature 412 tracks the shape of the backside source contact via 407, the width Wm' of the backside metal feature 412 would be greater than the width Wm of the frontside drain contact via 258. As such, in some embodiments, the semiconductor device 200 may include metal caps (e.g., the frontside drain metal cap 268 and the backside source metal cap 412) with two different dimensions.

After the formation of the backside metal cap 412, a backside power rail 413 is formed below the backside metal feature 412 and electrically connected to the S/D feature 224. The materials and the fabrication processes of the backside power rail 413 may be similar as the materials and the fabrication processes of the metal line 276. For example, the backside power rail 413 also includes barrier layers 414, 416 and a metal fill layer 418. Due to the formation of the backside metal cap 412, the backside power rail 413 is spaced apart from the backside source contact via 407 and thus electromigration between the backside power rail 413 and the backside source contact via 407 may be advantageously reduced or substantially eliminated. In addition, the contact resistance at the interface between the backside power rail 413 and backside source contact via 407 can be advantageously reduced. As such, the device performance is advantageously enhanced. Further fabrication processes may be also performed. For example, backside interconnect structure may be formed to electrically connected to the backside power rail 413, passivation layers may be formed on the backside of the semiconductor device 200.

Other embodiments of methods may be used to form the backside source contact via 407. For example, after flipping the workpiece 200 up-side-down (not shown), the back side of the workpiece 200 is planarized until the isolation feature 204 (not explicitly shown) is exposed. A patterned hard mask may be used to selectively expose a substrate region that is under the source feature 400 while covering a substrate region that is under the drain feature 224. The substrate 202 is then anisotropically etched until the bottom surface of the source feature 400 is exposed in a backside source contact opening. The source silicide feature 405 may be formed in the backside source contact opening and directly contacts the source feature 400. Then, the backside source contact via 407 (including the glue layer 408 and the metal fill layer 410) would be formed in the opening. For example, various deposition processes may be used to deposit the glue layer 408 and the metal fill layer 410. A planarization process, such as a CMP process, may follow the deposition process to remove excess materials and provide a planar surface. The materials for forming the backside source contact via 407 may be in a way similar to those of forming the frontside contact via 258. After the formation of the backside source contact via 407, in some embodiments, the substrate 202 may be replaced with the backside dielectric layer 406. The backside metal cap 412 and the backside power rail 413 may be then formed and electrically connected to the backside source contact via 407. The processes and materials for forming the backside metal cap 412 and the backside power rail 413 may be in a way similar to those of forming the metal cap 268 and the metal line 276.

An exemplary semiconductor structure includes a substrate having a source/drain feature, a dielectric layer over the substrate, a source/drain contact via extending through the dielectric layer and electrically connected to the source/drain feature, wherein the source/drain contact via is formed of a first material, a metal feature over the source/drain contact via, wherein the metal feature is formed of a second material different from the first material, and a metal line over the metal feature and electrically connected to the source/drain contact via. The metal line is formed of a third material different from the second material. The source/drain contact via is spaced apart from the metal line by the metal feature.

In some embodiments, a top surface of the metal feature may directly contact a portion of a bottom surface of the metal line, and a bottom surface of the metal feature may directly contact a top surface of the source/drain contact via. In some embodiments, a shape of a top surface of the metal feature may include a convex shape. In some embodiments, the source/drain contact via may include a glue layer and a metal fill material over the glue layer. In some embodiments, a bottom surface of the metal feature further may cover a portion of a top surface of the dielectric layer.

In some embodiments, the metal feature may be a first metal feature, the metal line is a first metal line, the semiconductor structure may also include a gate structure formed over the substrate and adjacent to the source/drain feature, a gate contact via extending through the dielectric layer and electrically connected to the gate structure, and a second metal feature disposed between a second metal line and the gate contact via, the second metal line being electrically connected to the gate contact via. The gate contact via may be spaced apart from the second metal line.

In some embodiments, the second material may also include ruthenium, molybdenum, copper, cobalt, or tungsten. In some embodiments, the metal line may include a barrier layer over the metal feature, wherein the barrier layer is formed of a fourth material different from the second material, and a metal fill layer over the barrier layer. A portion of a bottom surface of the barrier layer may directly contact the metal feature, and another portion of the bottom surface of the barrier layer may directly contact the dielectric layer. In some embodiments, a resistivity of the second material may be less than a resistivity of the fourth material.

In some embodiments, the source/drain feature is a drain feature, the dielectric layer is a first dielectric layer, the source/drain contact via is a frontside drain contact via, and the metal feature is a first metal feature. The semiconductor structure may also include a source feature, a second dielectric layer below the source feature, a backside source contact via extending through the second dielectric layer and electrically connected to the source feature, a second metal feature below the backside source contact via, and a backside power rail below the second metal feature and electrically connected to the frontside drain contact via, The backside source contact via may be spaced apart from the backside power rail.

Another exemplary semiconductor structure includes a contact via embedded in a dielectric layer, a barrier layer over the contact via and the dielectric layer, a metal fill layer over the barrier layer, and a conductive cap feature disposed between the contact via and the barrier layer, wherein the contact via is spaced apart from the barrier layer. The barrier layer is formed of a first material, and the conductive cap feature is formed of a second material, a resistivity of the second material is less than a resistivity of the first material.

In some embodiments, the barrier layer may directly contact a top surface of the conductive cap feature and a portion of a top surface of the dielectric layer. In some embodiments, the contact via may include a glue layer and a metal fill material over the glue layer. In some embodiments, the semiconductor structure may include a substrate having a source/drain feature and a source/drain contact layer over the source/drain feature. The contact via may extend through the dielectric layer and be electrically connected to the source/drain contact layer.

In some embodiments, the semiconductor structure may also include a self-aligned contact dielectric (SAC) feature over the source/drain contact layer, and the contact via may extend through the dielectric layer and the SAC feature and directly contact the source/drain contact layer. In some embodiments, the contact via may include cobalt, the metal fill layer may include ruthenium, and the conductive cap feature may include tungsten.

An exemplary method includes receiving a workpiece including a dielectric layer and a contact via extending through the dielectric layer, selectively forming a metal feature on a top surface of the contact via, forming a barrier layer over the metal feature and the dielectric layer, wherein the contact via is spaced apart from the barrier layer, and, forming a metal fill layer over the barrier layer. The metal feature is formed of a first material and the barrier layer is formed of a second material different from the first material.

In some embodiments, the selectively forming of the metal feature may include sequentially exposing the top surface of the contact via to a first gaseous precursor and a second gaseous precursor. The first gaseous precursor may include a compound including a conductive element. In some embodiments, the workpiece may include a substrate having a source/drain feature, a source/drain contact over the source/drain feature, and the dielectric layer over the source/drain contact. The contact via may be electrically connected to the source/drain contact. In some embodiments, the first material may include ruthenium, molybdenum, copper, cobalt, or tungsten, and a shape of the top surface of the metal feature may include a convex shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having a source/drain feature;
a dielectric layer over the substrate;
a source/drain contact via extending through the dielectric layer and electrically connected to the source/drain feature, wherein the source/drain contact via is formed of a first material, and wherein a top surface of the source/drain contact via is coplanar with a top surface of the dielectric layer;
a metal feature over the source/drain contact via, wherein the metal feature is formed of a second material different from the first material; and
a metal line over the metal feature and electrically connected to the source/drain contact via, wherein the metal line is formed of a third material different from the second material, wherein a portion of a bottom surface of the metal line directly contacts the metal feature, and another portion of the bottom surface of the metal line directly contacts the dielectric layer, and
wherein the source/drain contact via is spaced apart from the metal line by the metal feature.

2. The semiconductor structure of claim 1, wherein a bottom surface of the metal feature directly contacts the top surface of the source/drain contact via.

3. The semiconductor structure of claim 1, wherein a shape of a top surface of the metal feature comprises a convex shape.

4. The semiconductor structure of claim 1, wherein the source/drain contact via comprises a glue layer and a metal fill material over the glue layer.

5. The semiconductor structure of claim 1, wherein a bottom surface of the metal feature further covers a portion of the top surface of the dielectric layer.

6. The semiconductor structure of claim 1, wherein the metal feature is a first metal feature, the metal line is a first metal line, the semiconductor structure further comprises:
a gate structure formed over the substrate and adjacent to the source/drain feature;
a gate contact via extending through the dielectric layer and electrically connected to the gate structure; and
a second metal feature disposed between a second metal line and the gate contact via, the second metal line being electrically connected to the gate contact via,
wherein the gate contact via is spaced apart from the second metal line.

7. The semiconductor structure of claim 1, wherein the second material comprises ruthenium, molybdenum, copper, cobalt, or tungsten.

8. The semiconductor structure of claim 1, wherein the metal line comprises:
a barrier layer over the metal feature, wherein the barrier layer is formed of a fourth material different from the second material; and
a metal fill layer over the barrier layer.

9. The semiconductor structure of claim 8, wherein a resistivity of the second material is less than a resistivity of the fourth material.

10. The semiconductor structure of claim 1, wherein the source/drain feature is a drain feature, the dielectric layer is a first dielectric layer, the source/drain contact via is a frontside drain contact via, and the metal feature is a first metal feature, the semiconductor structure further comprises:
a source feature;
a second dielectric layer below the source feature;
a backside source contact via extending through the second dielectric layer and electrically connected to the source feature;
a second metal feature below the backside source contact via; and
a backside power rail below the second metal feature and electrically connected to the frontside drain contact via,
wherein the backside source contact via is spaced apart from the backside power rail.

11. A semiconductor structure, comprising:
a transistor formed over a substrate;
a contact via electrically coupled to the transistor;
a metal cap on the contact via; and
a metal line on the metal cap, wherein an entirety of the metal cap is embedded in the metal line,
wherein a composition of the metal cap is different from a composition of the contact via and a composition of the metal line, and
wherein the metal cap is disposed vertically between the metal line and the contact via.

12. The semiconductor structure of claim 11, wherein the transistor comprises a source feature, and the contact via is disposed over and electrically coupled to the source feature.

13. The semiconductor structure of claim 11, wherein the transistor comprises a gate structure, and the contact via is disposed over and electrically coupled to the gate structure.

14. The semiconductor structure of claim 11,
wherein a bottom surface of the metal cap spans a first width along a first direction, a top surface of the contact via spans a second width along the first direction, and a bottom surface of the metal line spans a third width along the first direction,
wherein the first width is greater than the second width and is less than the third width.

15. A semiconductor structure, comprising:
a substrate having a transistor;
a contact via extending through a dielectric layer over the transistor, wherein the contact via is electrically connected to the transistor;
a barrier layer over the contact via and the dielectric layer;
a metal fill layer over the barrier layer; and
a conductive cap feature disposed between the contact via and the barrier layer, wherein the contact via is spaced apart from the barrier layer, wherein an interface of the conductive cap feature and the contact via is coplanar with a portion of a bottom surface of the barrier layer, and
wherein the barrier layer is formed of a first material, and the conductive cap feature is formed of a second material, a resistivity of the second material is less than a resistivity of the first material.

16. The semiconductor structure of claim 15, wherein the barrier layer directly contacts a top surface of the conductive cap feature and a portion of the top surface of the dielectric layer.

17. The semiconductor structure of claim 15, wherein the contact via comprises a glue layer and a metal fill material over the glue layer.

18. The semiconductor structure of claim 15, further comprising:
a source/drain contact layer over a source/drain feature of the transistor,
wherein the contact via is electrically connected to the source/drain contact layer.

19. The semiconductor structure of claim 18, further comprising:
a self-aligned contact dielectric (SAC) feature over the source/drain contact layer, wherein the contact via further extends through the SAC feature and directly contacts the source/drain contact layer.

20. The semiconductor structure of claim 15, wherein the contact via comprises cobalt, the metal fill layer comprises ruthenium, and the conductive cap feature comprises tungsten.

* * * * *